(12) United States Patent
Sagara et al.

(10) Patent No.: US 9,997,502 B2
(45) Date of Patent: Jun. 12, 2018

(54) COMPONENT ARRANGEMENT DETERMINATION METHOD

(71) Applicant: Panasonic Intellectual Property Management Co., Ltd., Osaka (JP)

(72) Inventors: Hiroki Sagara, Yamanashi (JP); Takuya Yamazaki, Yamanashi (JP); Hirokazu Takehara, Yamanashi (JP); Isato Iwata, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 206 days.

(21) Appl. No.: 14/799,766

(22) Filed: Jul. 15, 2015

(65) Prior Publication Data

US 2016/0048127 A1 Feb. 18, 2016

(30) Foreign Application Priority Data

Aug. 18, 2014 (JP) .................................. 2014-165714

(51) Int. Cl.
  *H05K 3/00* (2006.01)
  *H01L 25/10* (2006.01)
  *G05B 19/418* (2006.01)

(52) U.S. Cl.
  CPC ........ *H01L 25/10* (2013.01); *G05B 19/41805* (2013.01); *G05B 2219/36195* (2013.01); *Y02P 90/04* (2015.11); *Y02P 90/20* (2015.11)

(58) Field of Classification Search
  CPC .............. H01L 25/10; G05B 19/41805; G05B 2219/36195; Y02P 90/04; Y02P 90/20
  (Continued)

(56) References Cited

U.S. PATENT DOCUMENTS

| 6,161,214 A * | 12/2000 | Ishihara ............... G05B 19/408 29/832 |
| 2003/0023418 A1* | 1/2003 | Kikuchi ................. G06Q 10/04 703/6 |

(Continued)

FOREIGN PATENT DOCUMENTS

| JP | H5-138467 A | 6/1993 |
| JP | 3830642 B2 | 7/2006 |
| WO | 2014/005741 A1 | 1/2014 |

OTHER PUBLICATIONS

Jouni Smed, Mika Johnsson, Tommi Johtela, and Olli Nevalainen, Techniques and Applications of Production Planning in Electronics Manufacturing Systems, Dec. 1999, Turku Centre for Computer Science, TUCS Technical Report No. 320, pp. 1-47.*

(Continued)

*Primary Examiner* — Kenneth M Lo
*Assistant Examiner* — Michael W Choi
(74) *Attorney, Agent, or Firm* — Pearne & Gordon LLP

(57) ABSTRACT

There is provided a component arrangement determination method, in a component mounting apparatus including a plurality of component supply units for supplying components, for determining arrangement of the component supply units used for production of a plurality of types of component mounted boards. The method includes specifying a production frequency of each of the plurality of types of component mounted boards for a predetermined period of time, grouping the plurality of types of component mounted boards into a plurality of groups capable of being produced without changing the arrangement of the component supply units based on the production frequency, and determining arrangement, in the component mounting apparatus, of the component supply units for supplying components neces- (Continued)

sary for production of types of component mounted boards that belong to each group of the plurality of groups.

5 Claims, 9 Drawing Sheets

(58) Field of Classification Search
USPC .......................................................... 700/97
See application file for complete search history.

(56) References Cited

U.S. PATENT DOCUMENTS

| | | | |
|---|---|---|---|
| 2006/0026072 A1* | 2/2006 | Suguro | G06Q 10/087 705/300 |
| 2015/0195966 A1 | 7/2015 | Pfaffinger et al. | |

OTHER PUBLICATIONS

Martin F. Stankard, Jr. and Shiv K. Gupta, A Note on Bomberger's Approach to Lot Size Scheduling: Heuristic Proposed, Mar. 1969, Informs, Management Science, vol. 15, No. 7, Theory Series, pp. 449-452.*

* cited by examiner

FIG. 6

| PRODUCTION DATE | PRODUCTION SCHEDULE 1 | PRODUCTION SCHEDULE 2 | PRODUCTION SCHEDULE 3 | PRODUCTION SCHEDULE 4 | ... |
|---|---|---|---|---|---|
| APRIL 1 | COMPONENT MOUNTED BOARD A | COMPONENT MOUNTED BOARD D | COMPONENT MOUNTED BOARD E | COMPONENT MOUNTED BOARD G | |
| APRIL 2 | COMPONENT MOUNTED BOARD E | COMPONENT MOUNTED BOARD A | COMPONENT MOUNTED BOARD F | COMPONENT MOUNTED BOARD G | |
| APRIL 3 | COMPONENT MOUNTED BOARD G | COMPONENT MOUNTED BOARD B | COMPONENT MOUNTED BOARD D | COMPONENT MOUNTED BOARD E | |
| ... | | | | | |
| APRIL 30 | COMPONENT MOUNTED BOARD H | COMPONENT MOUNTED BOARD G | COMPONENT MOUNTED BOARD A | COMPONENT MOUNTED BOARD D | |

| PRODUCTION FREQUENCY CLASS | PRODUCTION FREQUENCY GROUPING |
|---|---|
| CLASS 1 | 80% OR MORE |
| CLASS 2 | 20% OR MORE AND LESS THAN 80% |
| CLASS 3 | LESS THAN 20% |

| COMPONENT MOUNTED BOARD TYPE NAME | PRODUCTION FREQUENCY | PRODUCTION FREQUENCY CLASS |
|---|---|---|
| COMPONENT MOUNTED BOARD A | 95% | CLASS 1 |
| COMPONENT MOUNTED BOARD B | 5% | CLASS 3 |
| COMPONENT MOUNTED BOARD C | 5% | CLASS 3 |
| COMPONENT MOUNTED BOARD D | 85% | CLASS 1 |
| COMPONENT MOUNTED BOARD E | 50% | CLASS 2 |
| COMPONENT MOUNTED BOARD F | 30% | CLASS 2 |
| COMPONENT MOUNTED BOARD G | 90% | CLASS 1 |
| COMPONENT MOUNTED BOARD H | 10% | CLASS 3 |

FIG. 9A

| | PROVISIONAL GROUP A | PROVISIONAL GROUP D | PROVISIONAL GROUP G |
|---|---|---|---|
| PROVISIONAL GROUP A | | | |
| PROVISIONAL GROUP D | 10 | | |
| PROVISIONAL GROUP G | 30 | 15 | |

| | PROVISIONAL GROUP AG | PROVISIONAL GROUP D |
|---|---|---|
| PROVISIONAL GROUP AG | | |
| PROVISIONAL GROUP D | 18 | |

46a

COMPONENT ARRANGEMENT DETERMINATION METHOD

CROSS-REFERENCES TO RELATED APPLICATION(S)

This application is based on and claims priority from Japanese Patent Application No. 2014-165714 filed on Aug. 18, 2014, the entire contents of which are incorporated herein by reference.

BACKGROUND

1. Field of the Invention

The present invention relates to a component arrangement determination method for determining an arrangement of component supply unit in a component mounting apparatus that produces plural types of component mounted boards.

2. Description of Related Art

A component mounting apparatus that mounts an electronic component (hereinafter, referred to as a "component") onto a board to produce a component mounted board includes a plurality of component supply units (tape feeder, tray feeder, and the like) that supply components. When producing plural types of component mounted boards by such a component mounting apparatus, a so-called common arrangement in which the plural component supply units for supplying components used for production of the plural types of component mounted boards are arranged in the component mounting apparatus in a batch is performed. When the plural types of component mounted boards are continuously produced by performing the common arrangement, it is possible to reduce the number of times when the component supply units are exchanged (arrangement change). As a result, it is possible to reduce a time taken for an exchange of the component supply units, to thereby improve production efficiency. Further, in this regard, the common arrangement is generally determined in consideration of similarities of the components between plural types of component mounted boards of which production is scheduled (For example, see Japanese Patent No. 3830642 as Patent Literature 1).

In a technique disclosed in Japanese Patent No. 3830642, the types of component mounted boards having a lot of similarities with components to be mounted are grouped into the same group. Further, when producing plural types of the component mounted boards based on a production plan, an arrangement of component supply units for supplying the components (hereinafter, referred to as "component arrangement") is determined so that a cumulative value of an exchange time of the component supply units in the group becomes small.

Patent Literature 1: Japanese Patent No. 3830642

SUMMARY

In recent years, types of component mounted boards to be produced have been diversified. Accordingly, a production method for producing various types of component mounted boards in small production amounts has been widely used. In such a production method, when a production plan for production dates, types of component mounted boards to be produced, and production amounts are determined in a stage of preparing a common arrangement, it is possible to determine a component arrangement for high production efficiency with respect to all types of component mounted boards of which production is scheduled so that a cumulative value of a production time including exchange time of component supply units becomes small.

However, in such a production method, in many cases, the above-mentioned production plan is not determined. Rather, in most cases, in an initial stage of preparing the common arrangement, only types of component mounted boards of which production is scheduled for about one month to about six months may be approximately determined, but production dates and production amounts of specific types of component mounted boards may not be easily determined.

In this way, in a stage where the production plan is not definitely determined, it is difficult to determine an efficient combination of types of component mounted boards to be commonly arranged among a large number of combinations of types of component mounted boards, and to guarantee that a common arrangement determined in consideration of similarities between components is efficient.

Accordingly, a non-limited object of the present invention is to provide a component arrangement determination method for determining arrangement of component supply units, in which component mounted boards can be efficiently produced, in a component mounting apparatus that produces plural types of component mounted boards.

An aspect of the present invention provides a component arrangement determination method, in a component mounting apparatus including a plurality of component supply units for supplying components, for determining arrangement of the component supply units used for production of a plurality of types of component mounted boards, the method including: specifying a production frequency of each of the plurality of types of component mounted boards for a predetermined period of time; grouping the plurality of types of component mounted boards into a plurality of groups capable of being produced without changing the arrangement of the component supply units based on the production frequency; and determining arrangement, in the component mounting apparatus, of the component supply units for supplying components necessary for production of types of component mounted boards that belong to each group of the plurality of groups.

According to the present invention, it may be possible to determine arrangement of component supply units, in which component mounted boards can be efficiently produced, in a component mounting apparatus that produces plural types of component mounted boards.

BRIEF DESCRIPTION OF THE DRAWINGS

FIG. 6 is a diagram illustrating a production plan in a component mounting system according to an embodiment of the present invention.

FIG. 7 is a diagram illustrating a production frequency class grouping in a component arrangement determination method according to an embodiment of the present invention.

FIG. 8 is a diagram illustrating a class grouping result according to a production frequency class grouping in a component arrangement determination method according to an embodiment of the present invention.

FIGS. 9A and 9B are diagrams illustrating the number of components shared between provisional groups in a component arrangement determination method according to an embodiment of the present invention.

DETAILED DESCRIPTION

Figure 1:
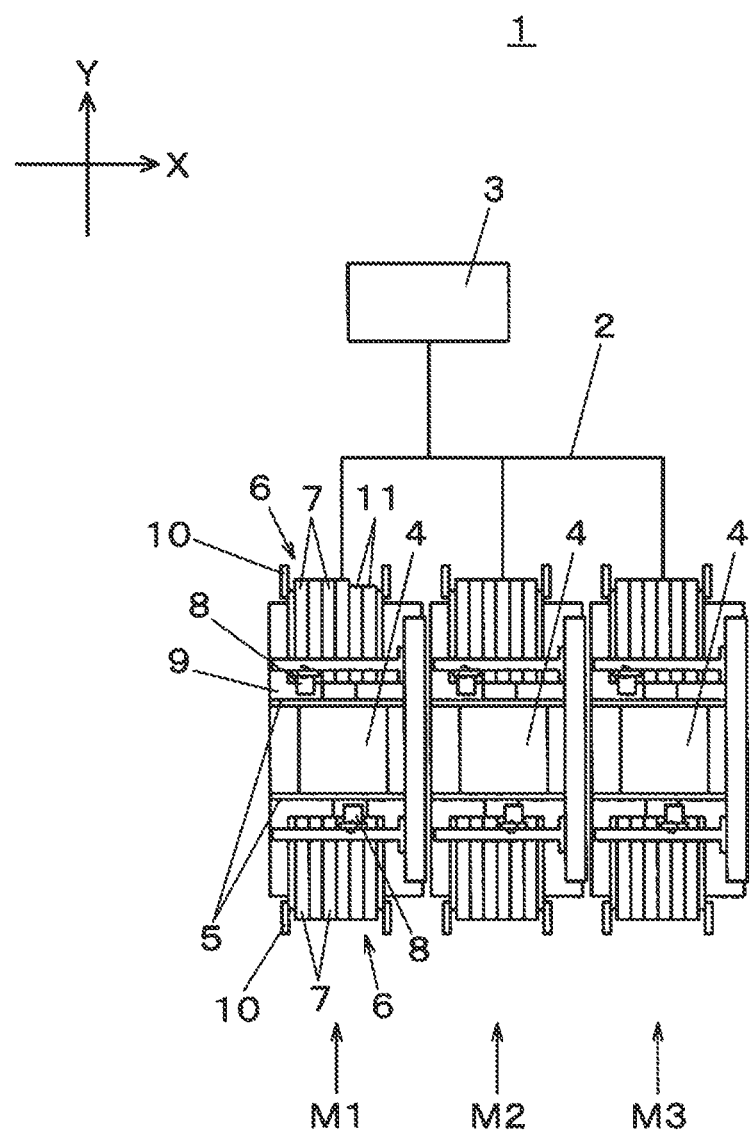
FIG. 1 is a diagram illustrating a configuration of a component mounting system according to an embodiment of the present invention.
Figure 2:
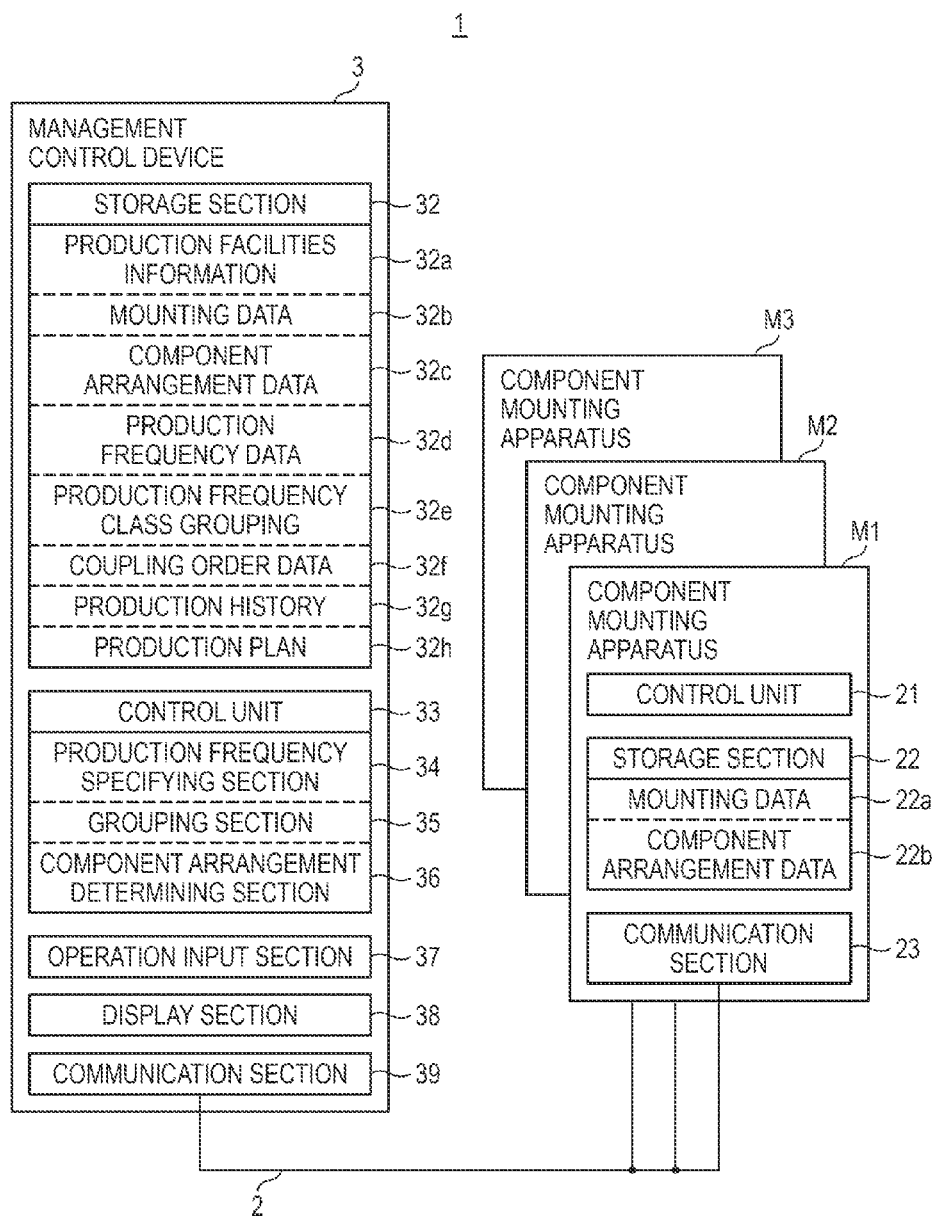
FIG. 2 is a block diagram illustrating a configuration of a component mounting system according to an embodiment of the present invention.

An embodiment of the present invention will be described with reference to the accompanying drawings. First, a configuration of a component mounting system 1 will be described with reference to FIGS. 1 and 2. The component mounting system 1 includes component mounting apparatuses M1, M2, and M3, a communication network 2, and a management control device 3. The component mounting apparatuses M1, M2, and M3 are aligned in an X direction (board transport direction). The communication network 2 is a wired or wireless communication network such as a LAN, and connects each of the component mounting apparatuses M1 to M3 to the management control device 3. The management control device 3 is connected to the component mounting apparatuses M1 to M3 through the communication network 2. The management control device 3 collects information from the component mounting apparatuses M1 to M3, and generally controls the component mounting apparatuses M1 to M3.

The component mounting apparatuses M1 to M3 are configured so that board transport mechanisms 5 that are respectively provided therein are connected in series to form a board transport path over the respective component mounting apparatuses M1 to M3. A board 4 for which solder printing is completed by a solder printer (not shown), which is a mounting target, is carried into the component mounting system 1. Specifically, the board 4 for which the solder printing is completed is carried into the board transport mechanism 5 of the component mounting apparatus M1 from an upstream side (left side in the figure). The component mounting apparatus M1 mounts a component allocated thereto onto the board 4. The component mounting apparatus M1 carries the board 4 for which the component mounting is completed toward the component mounting apparatus M2 which is a downstream side device.

The component mounting apparatuses M2 and M3 connected to the downstream side of the component mounting apparatus M1 have the same configuration as that of the component mounting apparatus M1. The board 4 carried from the component mounting apparatus M1 is carried into the component mounting apparatus M2, and the component mounting apparatus M2 mounts a component allocated thereto onto the board 4, similar to the component mounting apparatus M1. Similarly, the component mounting apparatus M3 mounts a component onto the board 4 carried thereto, and carries the board 4 for which the component mounting is completed to a downstream reflow device (not shown). The board 4 onto which the component is mounted is carried into the reflow device (not shown). The board 4 on which the component is mounted is heated according to a predetermined heating profile. Thus, the component bonding solder is melted and solidified. As a result, the components are solder-bonded to the board 4, so that a component mounted board onto which the components are mounted on the board 4 is completed.

Next, configurations of the component mounting apparatuses M1 to M3 will be described. Since the respective component mounting apparatuses M1 to M3 have the same configuration, the component mounting apparatus M1 will be described, and the other component mounting apparatuses M2 and M3 will not be described. The component mounting apparatus M1 includes a board transport mechanism 5, a component supply section 6, a mounting head 8, a base 9, a control unit 21, a storage section 22, and a communication section 23. The board transport mechanism 5 is provided on the base 9, and positions the board 4 carried in the component mounting apparatus M1 at a predetermined position, and carries the component mounted board 4 to a downstream side. The component supply sections 6 are provided on both sides (both sides on the paper in a Y direction) of the board transport mechanism 5. The component supply section 6 includes an exchange cart 10 connected to the base 9 and tape feeders 7 which are component supply units.

The tape feeders 7 are arranged in plural feeder slots 11 provided along the X-axis direction on the exchange cart 10. The respective arranged tape feeders 7 are arranged in the feeder slots 11 according to component arrangement data 32c (see FIG. 2) indicating component arrangement (to be described later). The exchange cart 10 is attachable to and detachable from the base 9 of the component mounting apparatus M1, and the exchange cart 10 is attached to or detached from the base 9 in a state where the tape feeders 7 are arranged therein. Thus, it is possible to exchange the tape feeders 7 in a batch on the component mounting apparatus M1. In this way, the component mounting apparatus M1 includes plural component supply units for supplying the components.

The mounting head 8 moves along the X-Y plane direction by a head movement mechanism (not shown) to mount the component supplied from the tape feeder 7 of the component supply section 6 onto the board 4 positioned by the board transport mechanism 5. The control unit 21 is a CPU, for example, and controls operations of respective components of the component mounting apparatus M1. The storage section 22 is a memory, and stores mounting data 22a and component arrangement data 22b used for the control of the control unit 21. The mounting data 22a includes information such as board sizes of all types of component mounted boards which are production targets, component types, and component mounting positions. Here, the different types of component mounted boards refer to component mounted boards that are different from each other in at least one of sizes of the boards, types of components to be mounted, and positions thereof, and thus, are different from each other in appearances thereof after component mounting.

In the present embodiment, the different types of component mounted boards may also refer to a single component mounted board with respect to a front surface and a rear surface thereof. The component arrangement data 22b is component arrangement data which is information about component types supplied by the respective component supply units and an arrangement position in the component supply section 6. The communication section 23 is a communication interface, and performs an exchange of signals between the management control device 3 and the other component mounting apparatuses M2 and M3 through the communication network 2.

In the present embodiment, all the component supply sections 6 are configured by the tape feeder 7 that supplies components by the carrier tape that holds the components, but each component supply section 6 is not limited to such a configuration. For example, the component supply section 6 may be configured by a stick feeder or the like capable of being mounted in the feeder slot 11 of the exchange cart 10, similar to the tape feeder 7. Further, the component mounting system 1 of the present embodiment is configured by the component mounting apparatuses M1 to M3 that are connected in series, but is not limited to such a configuration. For example, the component mounting system 1 may be configured by four or more component mounting apparatuses that are connected, or may be configured by a single component mounting apparatus. Further, the management control device 3 may be provided in any component mounting apparatus without being independently provided.

The management control device 3 includes a storage section 32, a control unit 33, an operation input section 37, a display section 38, and a communication section 39. The storage section 32 stores production facilities information 32a, mounting data 32b, component arrangement data 32c, production frequency data 32d, production frequency class grouping 32e, coupling order data 32f, a production history 32g, a production plan 32h, and the like.

The production facilities information 32a is information about production facilities connected to the management control device 3 through the communication network 2. The production facilities information 32a includes types and numbers of the component supply units capable of being arranged in the respective component supply sections 6 of the component mounting apparatuses M1 to M3, types and numbers of exchange carts capable of being used for production by being mounted in the component mounting apparatuses M1 to M3, and the like. The mounting data 32b is data referenced in the component mounting operation of the component mounting apparatuses M1 to M3, and includes board sizes of all types of component mounted boards which are production targets, component types, component mounting positions, and the like. The component arrangement data 32c includes information about arrangement positions of the respective component supply units in the component supply sections 6 corresponding to production of all types of component mounted boards which are production targets in the respective component mounting apparatuses M1 to M3, and information about types of components supplied by the component supply units.

The production frequency data 32d (which will be specifically described later) indicates production frequencies H of various component mounted boards for a predetermined period of time set by an operator. The production frequency class grouping 32e indicates grouping information for grouping the component mounted boards into plural classes according to grades of the production frequencies H. The coupling order data 32f is data on recording of a coupling order of provisional groups in a grouping process (which will be described later). The production history 32g indicates records such as type names, dates and times, and production amounts of produced component mounted boards. The production plan 32h is a plan such as dates and times when various component mounted boards are produced, or production amounts, and also includes a previously executed production plan or the like.

The control unit 33 includes a production frequency specifying section 34, a grouping section 35, and a component arrangement determining section 36. The production frequency specifying section 34 performs a process of specifying the production frequencies H of various component mounted boards based on input from an operator, calculation from a variety of information such as a production plan, or the like. The specified result is stored in the storage section 32 as the production frequency data 32d. The grouping section 35 performs a process of grouping the plural types of component mounted boards produced by the component mounting system 1 into groups of plural types of component mounted board capable of being produced without changing the component arrangement, based on the production frequencies H. The component arrangement determining section 36 determines component arrangement which is information about arrangement positions of the component supply units for supplying components necessary for production of the plural types of component mounted boards that belong to each group divided by the grouping process. The determined component arrangement is stored in the storage section 32 as the component arrangement data 32c.

The operation input section 37 is an input device such as a keyboard, a touch panel or a mouse, through which an input operation of an operation command, the production frequency data 32d, or the like is performed by an operator. The display section 38 is a display device such as a liquid crystal panel, and displays a guide screen or the like for the operation through the operation input section 37. The communication section 39 is a communication interface, and performs an exchange of signals between the component mounting apparatuses M1 to M3 through the communication network 2. A variety of data stored in each storage section 22 of the component mounting apparatuses M1 to M3 and the storage section 32 of the management control device 3 are synchronized at a predetermined timing.

Figure 3:
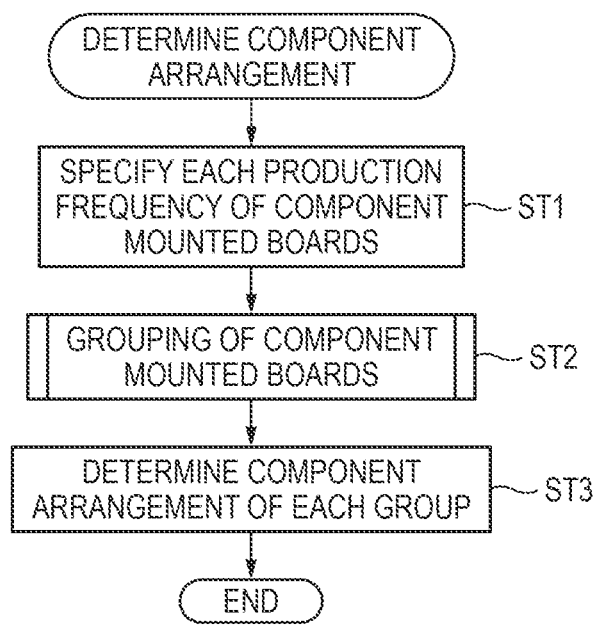
FIG. 3 is a flowchart of a component arrangement determination method according to an embodiment of the present invention.
Figure 4:
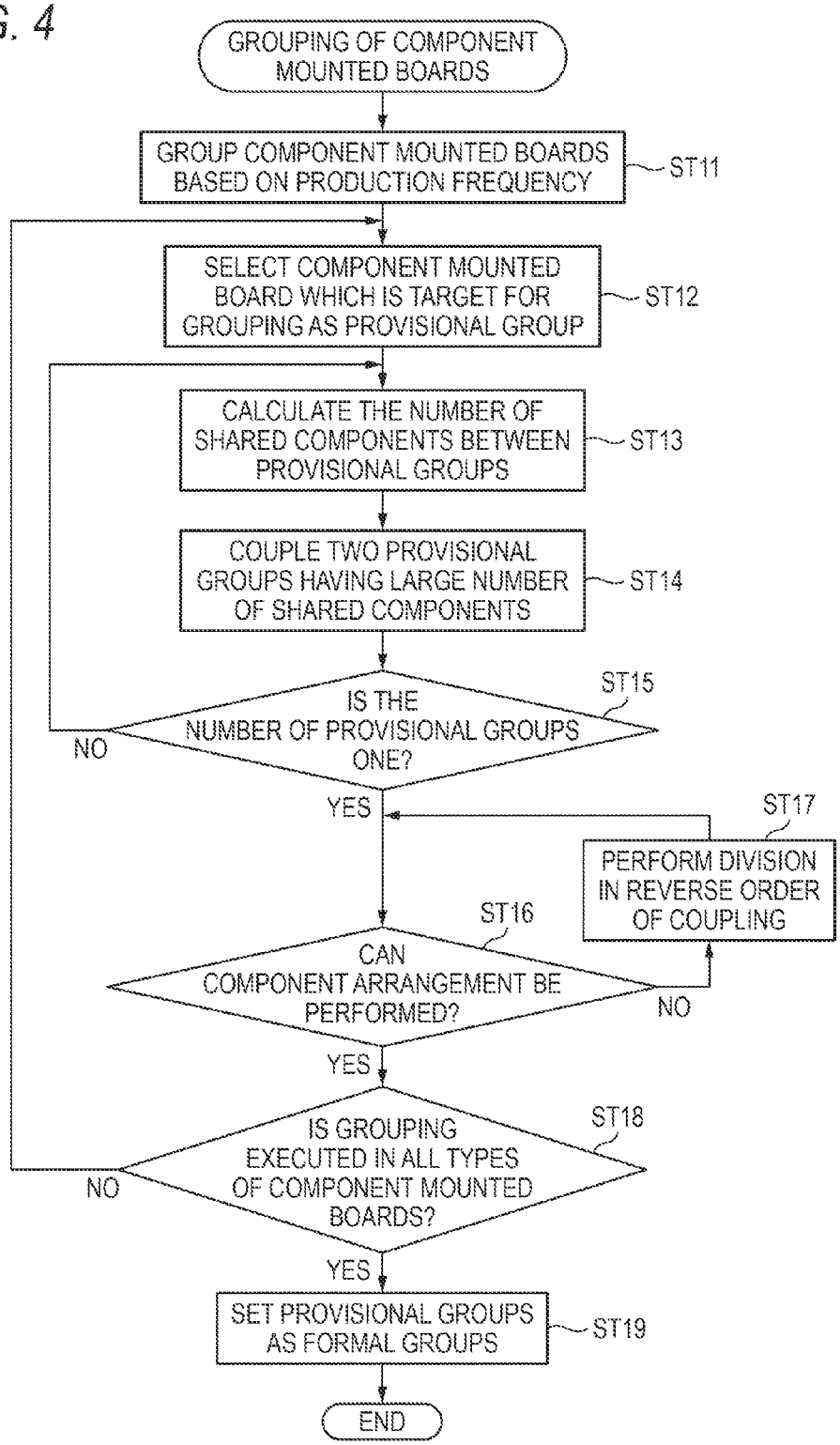
FIG. 4 is a flowchart of a component mounted board grouping process in a component arrangement determination method according to an embodiment of the present invention.

The component mounting system 1 according to the embodiment of the present invention has the above-described configuration. Next, a component arrangement determination method for determining arrangement of the component supply units to be used for production of plural types of component mounted boards according to an embodiment of the present invention will be described according to the flowcharts of FIGS. 3 and 4 with reference to FIG. 5 to FIGS. 10A to 10C. First, the production frequency specifying section 34 specifies each production frequency H of the plural types of component mounted boards produced in the component mounting system 1 (ST1: production frequency specification process) for a predetermined period of time. As a specification method of the production frequency H, a method for inputting the production frequency H through the operation input section 37 by an operator to directly specify the production frequency H, or a method for calculating the production frequency H from a variety of information about a production history, a previous or future production plan, or the like to specify the production frequency H may be used, for example.

A specific calculation method of the production frequency H will be described. As the calculation method of the production frequency H, two methods (which will be described later) may be used, for example. A first method is a method F1 for setting the ratio of the number of times of production Q of a relevant type of component mounted board which is a calculation target for the production frequency H with respect to a total number P of times of production of all types of component mounted boards that are scheduled in a production plan as the production frequency H, as indicated by (Expression 1).

$$H = Q/P \times 100 \quad \text{(Expression 1)}$$

When the number of times of production Q of U type component mounted boards which are calculation targets for the production frequency H is 48 and the total number P of times of production of all the types of component mounted boards that are scheduled in the production plan is 120, the production frequency H of the U type component mounted boards becomes 40%. According to the method F1, it is possible to precisely count the number of times of production that is approximately the same as the number of times of an arrangement change, and thus, it is possible to precisely predict a future production frequency H.

As indicated by (Expression 2), a second method is a method F2 for setting the ratio of the number of production days S of a relevant type of component mounted board which is a calculation target for the production frequency H with respect to the total number of production days R scheduled in a production plan.

$$H = S/R \times 100 \quad \text{(Expression 2)}$$

When the number of production days S of V type component mounted boards which are calculation targets for the production frequency H is 24 and the total number of production days R scheduled in the production plan is 30, the production frequency H of the V type component mounted boards becomes 80%. According to the method F2, since many types of component mounted boards are produced in one day, even when the same type of the arrangement change is executed plural times in one day, the number of arrangement changes per day is calculated as one. Thus, even in a complicated production plan for executing the arrangement change of the same type of component mounted board plural times in one day, it is possible to easily calculate the production frequency H of a relevant type of component mounted board.

Figure 5:
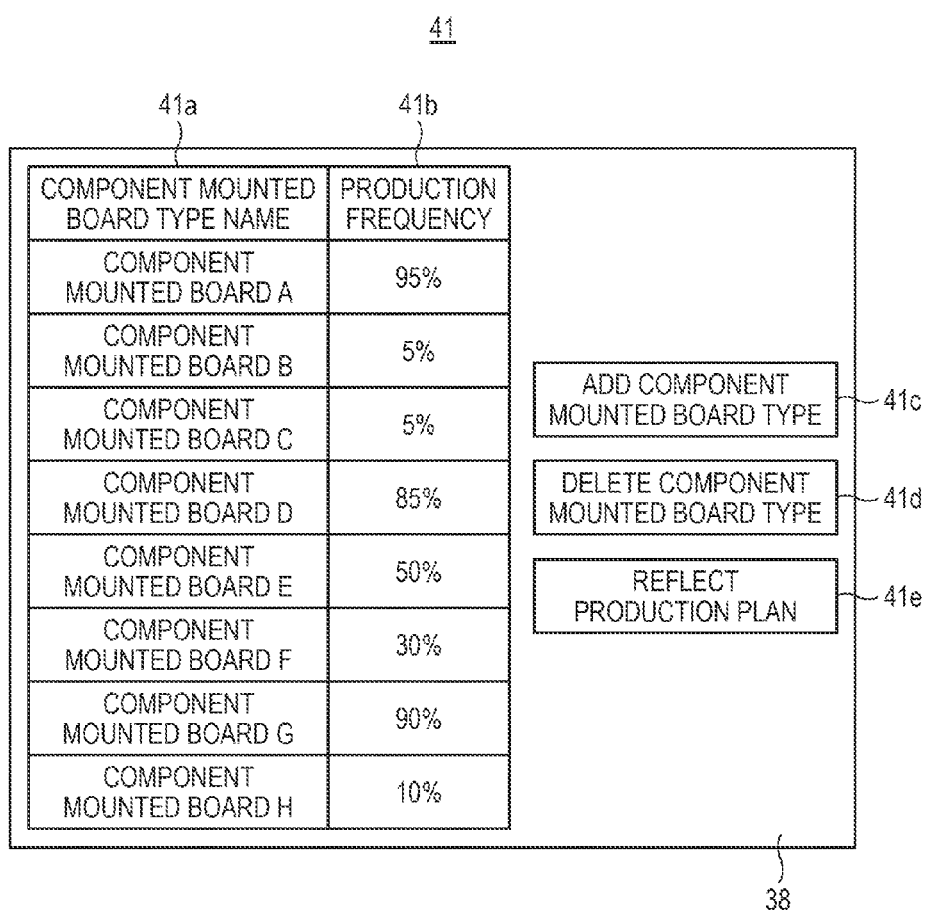
FIG. 5 is a diagram of a production frequency input screen in a component mounting system according to an embodiment of the present invention.

Next, a production frequency input screen 41 displayed in the display section 38 in the production frequency specification process (ST1) will be described with reference to FIG. 5. In a "component mounted board type name" column 41a, type names of component mounted boards of which production is scheduled (herein, component mounted boards A to H) are displayed. In a "production frequency" column 41b, production frequencies H corresponding to the type names of the component mounted boards are displayed. The production frequency H of a component mounted board having a type name selected by operation through the operation input section 37 may be manually input into the "production frequency" column 41b.

By operating an operation button "add component mounted board type" 41c, it is possible to add a new type of component mounted board into the "component mounted board type name" column 41a and the "production frequency" column 41b. By operating an operation button "delete component mounted board type" 41d, it is possible to delete information about the "component mounted board type name" column 41a and the "production frequency" column 41b of the selected type of component mounted board. By operating an operation button "production plan reflection" 41e, the production frequency specifying section 34 specifies the production frequency H based on the production history 32g or the production plan 32h, or based on both of them. That is, the production frequency specifying section 34 calculates the production frequencies H of the component mounted boards A to H according to a predetermined calculation expression (for example, method F1, method F2 or the like) to be input into the "production frequency" column 41b.

An example of the production plan 32h will be described with reference to FIG. 6. In a production plan table 42 shown in FIG. 6, an April production plan is denoted in a table form. A "production date" column 42a indicates a production schedule date, and in this example, dates of April 1 to April 30 are written therein. In a "production schedule" column 42b, type names of component mounted boards of which production is scheduled on production scheduled dates are displayed in a production order. "Production schedule 1" to "production schedule 4" indicates a production order of each production date. The production plan 32h includes a production plan that is scheduled to be executed in future production and a previous production plan already created and executed in the past. Further, similar to the production plan 32h, the production history 32g also includes information about production dates necessary for calculation of the production frequency H and type names of produced component mounted boards.

It is preferable that the production frequency H be specified from a production plan scheduled to be executed in the future, but it may be difficult to set up the future production plan due to reasons such as insufficient ordering information. Even in this case, the production frequency H may be specified based on the production history 32g or the previous production plan, or both of them, instead of the future production plan. That is, when the type or ratio of component mounted boards to be produced is not greatly changed from the past, the production frequency H specified from the production history 32g or a previous production plan has a small shift from the production frequency H specified from the future production plan, and thus, may be used instead. Further, by assigning a weight to information about the production history 32g or the past production plan with respect to an uncertain future production plan to specify the production frequency H, it is possible to improve the accuracy of prediction.

Subsequent to the production frequency specification process (ST1), the grouping section 35 groups the plural types of component mounted boards into plural groups capable of being produced without changing the arrangement of the tape feeders 7 or stick feeders which correspond to the component supply units based on the production frequency H (ST2: grouping process). Hereinafter, the grouping process (ST2) will be described using the component mounted boards A to H shown in FIG. 5 as examples according to the flowchart of FIG. 4. In the grouping process (ST2), the grouping section 35 groups the component mounted boards A to H based on predetermined production frequency class grouping 32e (ST11).

FIG. 7 shows an example of the production frequency class grouping 32e. A "production frequency class" column 43a of a production frequency class grouping table 43 indicates class names (class 1 to class 3), and a "production frequency grouping" column 43b indicates grouping based on grades of the production frequencies H of the respective classes. In this example, the types of the component mounted boards are grouped into three classes according to the grades of the production frequencies H. The number of "production frequency classes" and numerical values in the "production frequency grouping" are not limited to the illustrated examples, and may be appropriately set.

Table 44 in FIG. 8 shows a result obtained by grouping the component mounted boards A to H according to the production frequency class grouping 32e shown in FIG. 7. A "component mounted board type name" column 44*a* indicates type names of component mounted boards (component mounted boards A to H), and a "production frequency" column 44*b* indicates the production frequencies H of the component mounted boards A to H, and a "production frequency class" column 44*c* indicates a result obtained by grouping the component mounted boards A to H. For example, since the component mounted board A becomes the production frequency class 1 since the production frequency H is 95% and grouping of the production frequency is "80% or more".

The grouping section 35 selects the type of component mounted board which is a target for the grouping process as a provisional group (ST12). First, the types of component mounted boards (component mounted boards A, D, and G) corresponding to class 1 having the largest production frequency H in the production frequency grouping are selected as the provisional group. In this stage, the types of component mounted boards corresponding to class 2 and class 3 in the production frequency grouping are not selected, but when the procedure loops to ST18 (which will be described later) to execute ST12 again, the component mounted boards corresponding to class 2 and class 3 are sequentially selected. Through these processes, the grouping section 35 preferentially incorporates the types of component mounted boards having a high production frequency H into one group in the grouping process (ST2).

The grouping section 35 performs a process of calculating the number of shared components which are commonly used between the selected types of component mounted boards based on the information about the types of components mounted on the component mounted board in the mounting data 32*b* (ST13). Here, since the component mounted boards A, D, and G of the production frequency class 1 are selected, the number of shared components is calculated for the selected component mounted boards A, D, and G. First, the component mounted boards A, D, and G are set into provisional groups A, D, and G, respectively, and the number of shared components is calculated for couplings of two provisional groups (here, the provisional group A and the provisional group D, the provisional group A and the provisional group G, and the provisional group D and the provisional group G).

In sections where rows and columns cross in a table 45 shown in FIG. 9A, the numbers of shared components between the provisional groups A, D, and G calculated in the process of ST13 are shown. Specifically, in a section 45*a* where the row of the provisional group D and the column of the provisional group A cross, the number of shared components between the provisional group D and the provisional group A is shown. The number of shared components of the provisional group A and the provisional group D is ten as shown in the section 45*a*. Similarly, the number of shared components between the provisional group G and the provisional group A is shown in a section 45*b*, and the number of shared components between the provisional group G and the provisional group D is shown in a section 45*c*.

Then, the grouping section 35 couples two provisional groups having a large number of shared components based on the numbers of shared components calculated in ST13 (ST14: provisional group connecting process). Here, the provisional group A and the provisional group G having the largest number (here, 30) of shared components are connected to each other to form a new provisional group AG. Then, the grouping section 35 determines whether the number of provisional groups after execution of the process of ST14 is one (ST15). When the number of provisional groups is two or more, the procedure returns to ST13.

In this stage, since two provisional groups, that is, the provisional group AG and the provisional group D are present, the procedure returns to ST13, and the grouping section 35 calculates the number of shared components between the provisional groups with respect to the provisional groups selected in this stage. In a section 46*a* of table 46 shown in FIG. 9B, the number of shared components between the provisional group AG and the provisional group D is shown. Then, the grouping section 35 executes the provisional group connecting process (ST14) to couple the provisional group AG and the provisional group D to form a new provisional group AGD. Then, the grouping section 35 determines the number of provisional groups in ST15. Since the number of provisional groups in this stage is one, the procedure proceeds to the next process.

In this way, the grouping section 35 repeatedly performs the couplings (ST13 and ST14) of the two provisional groups in descending order of the number of shared components until the number of provisional groups becomes one. Further, the coupling order is stored in the storage section 32 as a coupling order data 32*f*. A tournament diagram 47 shown in FIG. 10A indicates the coupling order data 32*f* obtained by coupling the component mounted boards A, D, and G of the production frequency class 1 as the provisional groups A, D, and G in a tournament format. The tournament diagram 47 shows that the provisional group A and the provisional group G having the largest number of shared components are first coupled at a first coupling point 47*a* to form a provisional group AG Then, the provisional group AG and the provisional group D are coupled at a second coupling point 47*b* to form a provisional group AGD.

When it is determined in ST15 that the number of provisional groups is one, that is, when all the provisional groups are coupled to form one provisional group, the grouping section 35 determines whether the arrangement of the component supply units can be performed in the provisional group (ST16). That is, based on information about the type and number of the component supply units capable of being arranged in the component mounting system 1 of the production facilities information 32*a*, the number of exchange carts where the component supply units are mounted, or the like, the arrangement of the component supply units is changed. That is, the grouping section 35 determines whether the component arrangement where all types of component mounted boards included in the provisional group are producible without the arrangement change can be realized.

Here, with respect to the provisional group AGD, it is determined whether the component arrangement can be realized. In ST16, when it is determined that the component arrangement cannot be realized in the provisional group due to restrictions such as the number of component supply units which can be arranged or a combination of components, the grouping section 35 divides the provisional group into two provisional groups in reverse order of the coupling order of the provisional group (ST17: provisional group dividing process).

Since it is determined that the component arrangement cannot be realized, the provisional group AGD is divided at the second coupling point 47*b* where the provisional groups are finally coupled. That is, the provisional group AGD is divided into provisional group AG and provisional group D by the provisional group dividing process (ST17). In the tournament diagram 47, a division point where the division is executed is indicated by a double dot chain line as a first division point 47c.

After division in the provisional group dividing process (ST17), the procedure returns to ST16, and then, the grouping section 35 determines whether the component arrangement can be realized with respect to each of the provisional group AG and the provisional group D. When it is determined in ST16 that the component arrangement can be realized, the grouping section 35 determines whether the grouping is executed in all types of component mounted boards, that is, whether all types of component mounted boards are selected as the provisional groups in ST12 (ST18). When it is determined that the grouping is not executed in all types of component mounted boards, the procedure returns to ST12, and then, the grouping section 35 selects the type of component mounted board which is the next grouping target as a provisional group to be added to the grouping target.

In this stage, since the grouping of component mounted boards that belong to the production frequency classes 2 and 3 is not performed, the procedure returns to ST12, and then, the next grouping is executed by adding provisional groups E and F which are component mounted boards of the production frequency class 2 to the provisional groups AG and D.

Figure 10A:
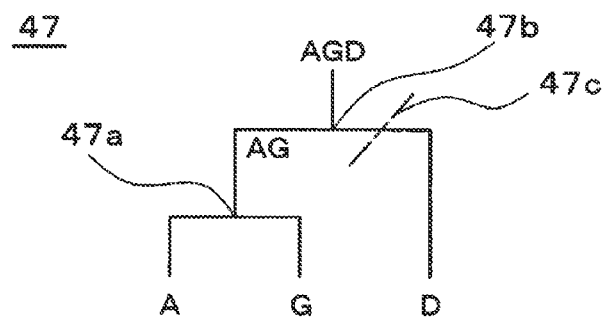
FIGS. 10A to 10C are tournament diagrams illustrating coupling order data in a component arrangement determination method according to an embodiment of the present invention.
Figure 10B:
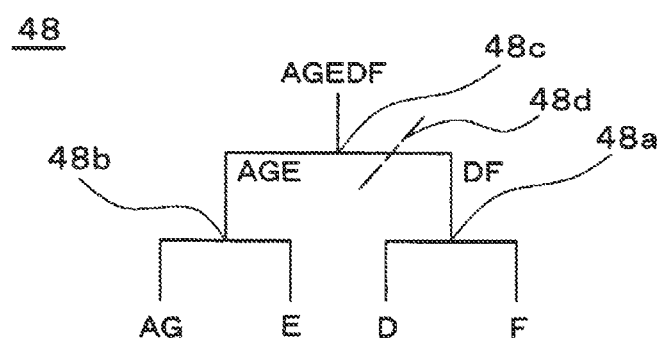

FIG. 10B shows a result of coupling of the provisional groups AG, D, E, and F as a tournament FIG. 48 based on the coupling order data 32f. The provisional group D and the provisional group F are coupled at a third coupling point 48a in descending order of the number of shared components to form a provisional group DF. Then, the provisional group AG and the provisional group E are coupled at a fourth coupling point 48b to form a provisional group AGE, and then, the provisional group AGE and the provisional group DF are coupled at a fifth coupling point 48c to form a provisional group AGEDF.

Next, in ST16, it is determined whether the component arrangement of the provisional group AGEDF can be realized. Since it is determined that the component arrangement cannot be realized in ST16, in the provisional group dividing process (ST17), the provisional group AGEDF is divided into the provisional group AGE and the provisional group DF at the fifth coupling point 48c (second division point 48d) where the provisional groups are finally coupled. Then, the procedure returns to ST16, and it is determined whether the component arrangement can be realized with respect to the provisional group AGE and the provisional group DF. Since it is determined in ST16 that the component arrangement can be realized, the procedure proceeds to ST18, and then, it is determined that the grouping is executed in all types of component mounted boards.

Figure 10C:
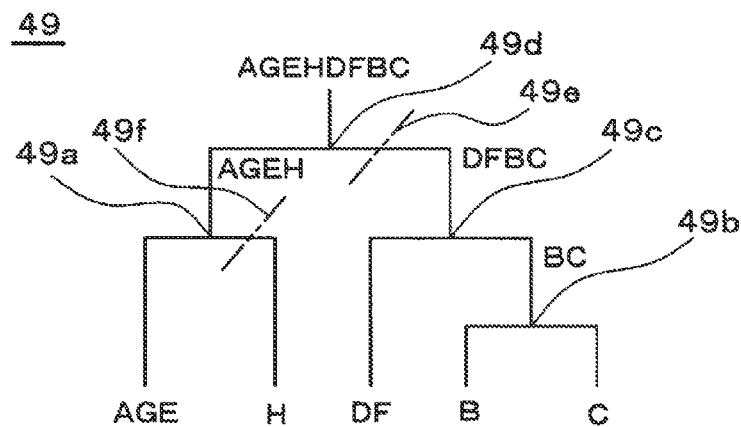

In this stage, since the grouping of the component mounted boards of the production frequency class 3 is not executed, the procedure returns to ST12. Then, the component mounted boards of the production frequency class 3 are selected as provisional groups B, C, and H, and then, the next grouping is executed, in addition. FIG. 10C shows a result of coupling of the provisional groups AGE, DF, B, C, and H as a tournament FIG. 49 based on the coupling order data 32f. In the current process, the provisional groups are coupled at a sixth coupling point 49a, a seventh coupling point 49b, an eighth coupling point 49c, and a ninth coupling point 49d to form a provisional group AGEHDFBC in descending order of the number of shared components.

Next, it is determined in ST16 whether the component arrangement can be realized with respect to each provisional group in ST16. When the component arrangement cannot be realized, the provisional group is divided in a reverse order of the coupling order in the provisional group dividing process (ST17). Here, it is determined that the component arrangement cannot be realized in the provisional group AGEHDFBC, and thus, the provisional group AGEHDFBC is divided at a ninth coupling point 49d (third division point 49e). Further, it is determined that the component arrangement cannot be realized in the provisional group AGEH after division, and thus, the provisional group AGEH is divided at the sixth coupling point 49a (fourth division point 490. As a result, the provisional groups are grouped into the provisional groups AGE, DFBC, and H where the component arrangement can be realized.

In ST18, when it is determined that the grouping is executed for all types of component mounted boards, the grouping section 35 sets the provisional groups in this stage as formal groups (ST19). That is, the provisional groups AGE, DFBC, and H are set as formal groups AGE, DFBC, and H, and then, the grouping process (ST2) is terminated. In this way, the grouping process (ST2) of grouping the plural types of component mounted boards into plural groups capable of being produced is performed based on the production frequency H, without changing the arrangement of the component supply units.

Subsequent to the grouping process (ST2), the component arrangement determining section 36 determines component arrangement in the component mounting system 1 with respect to each of the plural groups divided in the grouping process (ST2) (ST3: component arrangement determination process). For example, the component arrangement determining section 36 determines component arrangement, in the component mounting apparatuses M1 to M3 of the component mounting system 1, of the component supply units for supplying the components necessary for production of the component mounted boards A, G, and E that belong to the group AGE, with respect to the group AGE. Information about the determined component arrangement is stored in the storage section 32 as the component arrangement data 32c.

As a component arrangement determination method of each group in the component mounting system 1, there are various methods such as a method for preferentially arranging a type of component mounted board having a high production frequency H among component mounted boards included in the group so that a production time thereof is reduced, and a method for preferentially arranging a type of component mounted board having a large number of components, but any method may be used as necessary.

As described above, with respect to the plural groups divided in the grouping process (ST2), the component arrangement determination process (ST3) of determining the arrangement, in the component mounting apparatuses M1 to M3 of the component mounting system 1, of the component supply units for supplying components necessary for production of types of component mounted boards that belong to each group is executed, and then, the component arrangement determination process is terminated. Then, arrangement such as arrangement of the component supply units in each exchange cart is performed by an operator based on the component arrangement data 32c displayed in the display section 38 or the like.

In this way, if components are arranged in the component mounting system 1 corresponding to a specific group, even though types of component mounted boards to be produced are changed while component mounted boards that belong to the specific group are being produced, it is not necessary to perform the arrangement change for component arrangement. For example, in the component arrangement corresponding to the group AGE, it is not necessary to perform the arrangement change for component arrangement when the component mounted boards A, E, and G are continuously produced.

In the present embodiment, as described above, the plural types of component mounted boards are divided into plural groups capable of being produced based on the production frequency H without changing arrangement of the component supply units. Specifically, types of component mounted boards having a high production frequency H are incorporated into one group in consideration of a long term production plan to determine component arrangement. Thus, in production of the component mounted boards over a long period of time, it is possible to reduce the number of times of arrangement change for component arrangement. Thus, it is possible to reduce a temporary stopping time in production of the component mounted boards due to the arrangement change, and to efficiently produce the component mounted boards.

The grouping process is not limited to the above-described methods, and any method for dividing plural types of component mounted boards into plural groups capable of being produced without changing arrangement of the component supply units based on the production frequency H may be used.

In the present embodiment, as described above, when determining component arrangement which is arrangement of the component supply units such as the tape feeders 7, plural types of component mounted boards are divided into plural groups capable of being produced without changing arrangement of the component supply units based on each production frequency H of the plural types of component mounted boards for a predetermined period of time, and arrangement, in the component mounting system 1, of the component supply units for supplying components necessary for production of component mounted boards that belong to each group is determined. Thus, it is possible to perform component arrangement so that types of component mounted boards having high production frequency H are incorporated into the same group, and thus, in the component mounting apparatus that produces plural types of component mounted boards, it is possible to efficiently produce component mounted boards with respect to a long term production plan.

According to the embodiment of the present invention, it may be possible to efficiently produce component mounted boards with respect to a long term production plan, which is useful in a manufacturing field of the component mounted boards.

What is claimed is:

1. A component arrangement determination method, in a component mounting apparatus including a plurality of component supply units for supplying components, for determining arrangement of the component supply units used for production of a plurality of types of component mounted boards, the method comprising:
   specifying a production frequency of each of the plurality of types of component mounted boards for a predetermined period of time;
   grouping the plurality of types of component mounted boards into a plurality of groups capable of being produced without changing the arrangement of the component supply units based on the production frequency;
   determining arrangement, in the component mounting apparatus, of the component supply units for supplying components necessary for production of types of component mounted boards that belong to each group of the plurality of groups; and
   producing a plurality of types of component mounted boards based on the grouping;
   wherein the step of grouping comprises:
      classifying the plurality of types of component mounted boards into a plurality of classes according to grades of the production frequency;
      selecting one of the plurality of classes;
      making a provisional group coupling two types of component mounted boards having a largest number of shared components included in the selected class;
      repeating the step of making the provisional group until all of the plurality of types of component mounted boards are coupled; and
      determining whether the arrangement of the component supply units is performed in the provisional group,
      wherein in the selecting step, the selecting is performed in order from a class with a highest production frequency.

2. The component arrangement determination method according to claim 1, wherein in the grouping, types of component mounted boards having a high production frequency is preferentially incorporated into one group.

3. The component arrangement determination method according to claim 1, wherein the production frequency is a ratio of a number of times of production of a relevant type of component mounted board with respect to a total number of times of production of all types of component mounted boards.

4. The component arrangement determination method according to claim 1, wherein the production frequency is a ratio of a number of production days of a relevant type of component mounted board with respect to a total number of production days.

5. The component arrangement determination method according to claim 1, wherein in the specifying of the production frequency, the production frequency is specified based on a production history or a production plan, or based on both the production history and the production plan.

* * * * *